US012473631B2

(12) United States Patent
Givens et al.

(10) Patent No.: US 12,473,631 B2
(45) **Date of Patent: *Nov. 18, 2025**

(54) SIMULTANEOUS SELECTIVE DEPOSITION OF TWO DIFFERENT MATERIALS ON TWO DIFFERENT SURFACES

(71) Applicant: ASM IP HOLDING B.V., Almere (NL)

(72) Inventors: Michael Eugene Givens, Oud-Heverlee (BE); Eva Tois, Helsinki (FI); Suvi Haukka, Helsinki (FI); Daria Nevstrueva, Helsinki (FI); Charles Dezelah, Helsinki (FI)

(73) Assignee: ASM IP Holding B.V., Almere (NL)

( * ) Notice: Subject to any disclaimer, the term of this patent is extended or adjusted under 35 U.S.C. 154(b) by 51 days.

This patent is subject to a terminal disclaimer.

(21) Appl. No.: 18/170,286

(22) Filed: Feb. 16, 2023

(65) Prior Publication Data

US 2023/0203644 A1 Jun. 29, 2023

Related U.S. Application Data

(63) Continuation of application No. 17/216,260, filed on Mar. 29, 2021, now Pat. No. 11,608,557.

(Continued)

(51) Int. Cl.
*C23C 16/04* (2006.01)
*C23C 16/02* (2006.01)

(Continued)

(52) U.S. Cl.
CPC .......... *C23C 16/04* (2013.01); *C23C 16/0281* (2013.01); *C23C 16/20* (2013.01);

(Continued)

(58) Field of Classification Search
CPC ....... C23C 16/04; C23C 16/40; C23C 16/403; C23C 16/405; C23C 16/45527; C23C 16/45544

See application file for complete search history.

(56) References Cited

U.S. PATENT DOCUMENTS 4,804,640 A 2/1989 Kaganowicz
4,863,879 A 9/1989 Kwok (Continued)

FOREIGN PATENT DOCUMENTS

CN 110993482 4/2020
CN 111816547 10/2020

(Continued)

OTHER PUBLICATIONS

Hashemi, Fatemeh Sadat Minaye, et al., "Selective Deposition of Dielectrics: Limits and Advantages of Alkanethiol Blocking Agents on Metal-Dielectric Patterns". ACS Appl. Mater. Interfaces 2016, 8, 33264-33272.*

(Continued)

*Primary Examiner* — Bret P Chen
(74) *Attorney, Agent, or Firm* — Banner & Witcoff, Ltd.

(57) ABSTRACT

In some embodiments, methods are provided for simultaneously and selectively depositing a first material on a first surface of a substrate and a second, different material on a second, different surface of the same substrate using the same reaction chemistries. For example, a first material may be selectively deposited on a metal surface while a second material is simultaneously and selectively deposited on an adjacent dielectric surface. The first material and the second material have different material properties, such as different etch rates.

21 Claims, 3 Drawing Sheets

Related U.S. Application Data

(60) Provisional application No. 63/001,898, filed on Mar. 30, 2020.

(51) Int. Cl.
*C23C 16/20* (2006.01)
*C23C 16/455* (2006.01)
*C23C 16/56* (2006.01)
*C23C 28/00* (2006.01)

(52) U.S. Cl.
CPC ........ *C23C 16/45534* (2013.01); *C23C 16/56* (2013.01); *C23C 28/341* (2013.01)

(56) References Cited

U.S. PATENT DOCUMENTS 4,948,755 A 8/1990 Mo
5,288,697 A 2/1994 Schrepp et al.
5,447,887 A 9/1995 Filipiak et al.
5,604,153 A 2/1997 Tsubouchi et al.
5,633,036 A 5/1997 Seebauer et al.
5,869,135 A 2/1999 Vaeth et al.
5,925,494 A 7/1999 Horn
6,046,108 A 4/2000 Liu et al.
6,416,577 B1 7/2002 Suntoloa et al.
6,426,015 B1 7/2002 Xia et al.
6,455,414 B1 9/2002 Hillman et al.
6,482,740 B2 11/2002 Soininen et al.
6,586,330 B1 7/2003 Ludviksson et al.
6,679,951 B2 1/2004 Soininen et al.
6,759,325 B2 7/2004 Raaijmakers et al.
6,811,448 B1 11/2004 Paton
6,844,258 B1 1/2005 Fair et al.
6,852,635 B2 2/2005 Satta et al.
6,858,533 B2 2/2005 Chu et al.
6,878,628 B2 4/2005 Sophie et al.
6,887,795 B2 5/2005 Soininen et al.
6,921,712 B2 7/2005 Soininen et al.
6,958,174 B1 10/2005 Klaus et al.
7,041,609 B2 5/2006 Vaartstra
7,067,407 B2 6/2006 Kostamo et al.
7,084,060 B1 8/2006 Furukawa et al.
7,118,779 B2 10/2006 Verghese et al.
7,220,669 B2 5/2007 Hujanen et al.
7,241,677 B2 7/2007 Soininen et al.
7,323,411 B1 1/2008 Blosse
7,405,143 B2 7/2008 Leinikka et al.
7,425,350 B2 9/2008 Todd
7,476,618 B2 1/2009 Kilpela et al.
7,494,927 B2 2/2009 Kostamo et al.
7,595,271 B2 9/2009 White
7,611,751 B2 11/2009 Elers
7,695,567 B2 4/2010 Fu
7,754,621 B2 7/2010 Putkonen
7,790,631 B2 9/2010 Sharma et al.
7,799,135 B2 9/2010 Verghese et al.
7,910,177 B2 3/2011 Li
7,914,847 B2 3/2011 Verghese et al.
7,927,942 B2 4/2011 Raaijmakers
7,951,637 B2 5/2011 Weidman et al.
7,955,979 B2 6/2011 Kostamo et al.
7,964,505 B2 6/2011 Khandelwal et al.
8,173,554 B2 5/2012 Lee et al.
8,293,597 B2 10/2012 Raaijmakers
8,293,658 B2 10/2012 Shero et al.
8,425,739 B1 4/2013 Wieting
8,466,052 B2 6/2013 Baek et al.
8,536,058 B2 9/2013 Kostamo et al.
8,623,468 B2 1/2014 Lin et al.
8,778,815 B2 7/2014 Yamaguchi et al.
8,890,264 B2 11/2014 Dewey et al.
8,956,971 B2 2/2015 Haukka et al.
8,962,482 B2 2/2015 Albertson et al.
8,980,418 B2 3/2015 Darling et al.
8,993,404 B2 3/2015 Korbrinsky et al.
9,067,958 B2 6/2015 Romero
9,112,003 B2 8/2015 Haukka et al.
9,129,897 B2 9/2015 Pore et al.
9,136,110 B2 9/2015 Rathsack
9,159,558 B2 10/2015 Cheng et al.
9,236,292 B2 1/2016 Romero et al.
9,257,303 B2 2/2016 Haukka et al.
9,312,131 B2 4/2016 Bauer et al.
9,349,687 B1 5/2016 Gates et al.
9,353,139 B2 5/2016 Sundermeyer et al.
9,455,138 B1 9/2016 Fukazawa et al.
9,490,145 B2 11/2016 Niskanen et al.
9,502,289 B2 11/2016 Haukka et al.
9,552,979 B2 1/2017 Knaepen et al.
9,679,808 B2 6/2017 Haukka et al.
9,786,491 B2 10/2017 Suzuki et al.
9,786,492 B2 10/2017 Suzuki et al.
9,803,277 B1 10/2017 Longrie et al.
9,805,974 B1 10/2017 Chen et al.
9,816,180 B2 11/2017 Haukka et al.
9,895,715 B2 2/2018 Haukka et al.
9,911,595 B1 3/2018 Smith et al.
10,014,212 B2 7/2018 Chen et al.
10,041,166 B2 8/2018 Longrie et al.
10,047,435 B2 8/2018 Haukka et al.
10,049,924 B2 8/2018 Haukka et al.
10,115,603 B2 10/2018 Niskanen et al.
10,157,786 B2 12/2018 Haukka et al.
10,186,420 B2 1/2019 Fukazawa
10,204,782 B2 2/2019 Maes et al.
10,343,186 B2 7/2019 Pore et al.
10,347,495 B2 7/2019 Basu et al.
10,373,820 B2 8/2019 Tois et al.
10,428,421 B2 10/2019 Haukka et al.
10,443,123 B2 10/2019 Haukka et al.
10,453,701 B2 10/2019 Tois et al.
10,480,064 B2 11/2019 Longrie et al.
10,510,546 B2 12/2019 Basu et al.
10,546,741 B2 1/2020 Muramaki et al.
10,695,794 B2 6/2020 Pore et al.
10,847,363 B2 11/2020 Tapily
10,872,765 B2 12/2020 Tois et al.
10,900,120 B2 1/2021 Sharma et al.
11,094,535 B2 8/2021 Tois et al.
11,396,701 B2 7/2022 Sharma et al.
11,501,966 B2 11/2022 Tois et al.
11,608,557 B2 * 3/2023 Givens .................... C23C 16/02
11,739,422 B2 8/2023 Sharma et al.
11,804,373 B2 10/2023 Tois et al.
2001/0019803 A1 9/2001 Mirkanimi
2001/0021414 A1 9/2001 Morishima et al.
2001/0025205 A1 9/2001 Chern et al.
2002/0027261 A1 3/2002 Blesser et al.
2002/0047144 A1 4/2002 Nguyen et al.
2002/0068458 A1 6/2002 Chiang et al.
2002/0090777 A1 7/2002 Forbes et al.
2002/0107316 A1 8/2002 Bice et al.
2002/0123561 A1 * 9/2002 Rose .................... C09D 183/14
524/588
2003/0027431 A1 2/2003 Sneh et al.
2003/0066487 A1 4/2003 Suzuki
2003/0143839 A1 7/2003 Raaijmakers et al.
2003/0176559 A1 9/2003 Bice et al.
2003/0181035 A1 9/2003 Yoon et al.
2003/0185997 A1 10/2003 Hsieh
2003/0192090 P1 10/2003 Meilland
2003/0193090 A1 10/2003 Otani et al.
2004/0092073 A1 5/2004 Cabral
2004/0121502 A1 * 6/2004 Summers ................ H01L 33/50
438/47
2004/0129558 A1 7/2004 Liu et al.
2004/0219746 A1 11/2004 Vaartstra et al.
2004/0266185 A1 12/2004 Doke et al.
2005/0012975 A1 1/2005 George et al.
2005/0112282 A1 5/2005 Gordon et al.
2005/0136604 A1 6/2005 Al-Bayati et al.
2005/0160575 A1 7/2005 Gambino et al.
2005/0223989 A1 10/2005 Lee et al.
2006/0019493 A1 1/2006 Li

(56) References Cited

U.S. PATENT DOCUMENTS

2006/0047132 A1 3/2006 Shenai-Khatkhate et al.
2006/0121271 A1 6/2006 Frey et al.
2006/0121677 A1 6/2006 Parekh et al.
2006/0121733 A1 6/2006 Kilpela et al.
2006/0128150 A1 6/2006 Gandikota et al.
2006/0141155 A1 6/2006 Gordon et al.
2006/0156979 A1 7/2006 Thakur et al.
2006/0176559 A1 8/2006 Takatoshi et al.
2006/0199399 A1 9/2006 Muscat
2006/0226409 A1 10/2006 Burr et al.
2006/0292845 A1 12/2006 Chiang et al.
2007/0014919 A1 1/2007 Hamalainen et al.
2007/0026654 A1 2/2007 Huotari et al.
2007/0036892 A1 2/2007 Haukka et al.
2007/0063317 A1 3/2007 Kim et al.
2007/0098894 A1 5/2007 Verghese et al.
2007/0099422 A1 5/2007 Wijekoon et al.
2007/0232082 A1 10/2007 Balseanu et al.
2007/0241390 A1 10/2007 Tanaka et al.
2007/0251444 A1 11/2007 Gros-Jean et al.
2007/0292604 A1 12/2007 Dordi et al.
2008/0032064 A1 2/2008 Gordon et al.
2008/0066680 A1 3/2008 Sherman
2008/0072819 A1 3/2008 Rahtu
2008/0124932 A1 5/2008 Tateishi et al.
2008/0179741 A1 7/2008 Streck et al.
2008/0241575 A1 10/2008 Lavoie et al.
2008/0282970 A1 11/2008 Heys et al.
2009/0035949 A1 2/2009 Niinisto et al.
2009/0071505 A1 3/2009 Miya et al.
2009/0081385 A1 3/2009 Heys et al.
2009/0203222 A1 8/2009 Dussarrat et al.
2009/0269507 A1 10/2009 Yu et al.
2009/0274887 A1 11/2009 Millward et al.
2009/0275163 A1 11/2009 Lacey et al.
2009/0311879 A1 12/2009 Blasco et al.
2010/0015756 A1 1/2010 Weidman et al.
2010/0102417 A1 4/2010 Ganguli et al.
2010/0147396 A1 6/2010 Yamagishi et al.
2010/0178468 A1 7/2010 Jiang et al.
2010/0248473 A1 9/2010 Ishizaka et al.
2010/0270626 A1 10/2010 Raisanen
2010/0297474 A1 11/2010 Dameron
2010/0314765 A1 12/2010 Liang et al.
2011/0039420 A1 2/2011 Nakao
2011/0053800 A1 3/2011 Jung et al.
2011/0120542 A1 5/2011 Levy
2011/0124192 A1 5/2011 Ganguli et al.
2011/0146568 A1 6/2011 Haukka et al.
2011/0146703 A1 6/2011 Chen et al.
2011/0198756 A1 8/2011 Thenappan et al.
2011/0221061 A1 9/2011 Prakash et al.
2011/0244680 A1 10/2011 Tahnoe et al.
2011/0311726 A1 12/2011 Liu et al.
2012/0032311 A1 2/2012 Gates
2012/0046421 A1 2/2012 Darling et al.
2012/0052681 A1 3/2012 Marsh
2012/0088369 A1 4/2012 Weidman et al.
2012/0091541 A1 4/2012 Suchomel et al.
2012/0189868 A1 7/2012 Borovik et al.
2012/0219824 A1 8/2012 Prolier et al.
2012/0241411 A1 9/2012 Darling et al.
2012/0264291 A1 10/2012 Ganguli et al.
2012/0269970 A1 10/2012 Ido et al.
2013/0005133 A1 1/2013 Lee et al.
2013/0078793 A1 3/2013 Sun et al.
2013/0084700 A1 4/2013 Swerts et al.
2013/0089983 A1 4/2013 Sugita et al.
2013/0095664 A1 4/2013 Matero et al.
2013/0115763 A1 5/2013 Takamure et al.
2013/0115768 A1 5/2013 Pore et al.
2013/0126815 A1 5/2013 Kim et al.
2013/0143401 A1 6/2013 Yu et al.
2013/0146881 A1 6/2013 Yamazaki et al.
2013/0157409 A1 6/2013 Vaidya et al.
2013/0189790 A1 7/2013 Li et al.
2013/0189837 A1 * 7/2013 Haukka ............. H01L 21/02697 438/655
2013/0196502 A1 * 8/2013 Haukka ............. H01L 21/76849 438/653
2013/0203267 A1 8/2013 Pomarede et al.
2013/0280919 A1 10/2013 Yuasa et al.
2013/0284094 A1 10/2013 Pavol et al.
2013/0309457 A1 11/2013 Rathsack et al.
2013/0316080 A1 11/2013 Yamaguchi et al.
2013/0319290 A1 12/2013 Xiao et al.
2013/0323930 A1 12/2013 Chattopadhyay et al.
2013/0330936 A1 12/2013 Lachaud et al.
2014/0001572 A1 1/2014 Bohr et al.
2014/0024200 A1 1/2014 Kato et al.
2014/0091308 A1 4/2014 Dasgupta et al.
2014/0120738 A1 5/2014 Jung et al.
2014/0152383 A1 6/2014 Nikonov et al.
2014/0190409 A1 7/2014 Matsumoto et al.
2014/0193598 A1 7/2014 Traser et al.
2014/0205766 A1 7/2014 Lyon et al.
2014/0209022 A1 7/2014 Inoue et al.
2014/0227461 A1 8/2014 Darwish et al.
2014/0252487 A1 9/2014 Stephens et al.
2014/0272194 A1 9/2014 Xiao et al.
2014/0273290 A1 9/2014 Somervell
2014/0273477 A1 9/2014 Niskanen et al.
2014/0273514 A1 9/2014 Somervell et al.
2014/0273523 A1 9/2014 Rathsack
2014/0273527 A1 9/2014 Niskanen et al.
2015/0004317 A1 1/2015 Dussarrat et al.
2015/0004319 A1 1/2015 Mizue
2015/0004806 A1 1/2015 Ndiege et al.
2015/0011032 A1 1/2015 Kunimatsu et al.
2015/0011093 A1 1/2015 Singh et al.
2015/0037972 A1 2/2015 Danek et al.
2015/0064931 A1 3/2015 Kumagi et al.
2015/0083415 A1 3/2015 Monroe et al.
2015/0087158 A1 3/2015 Sugita et al.
2015/0093890 A1 4/2015 Blackwell et al.
2015/0097292 A1 4/2015 He et al.
2015/0118863 A1 4/2015 Rathod et al.
2015/0162214 A1 6/2015 Thompson et al.
2015/0170961 A1 6/2015 Romero et al.
2015/0179798 A1 6/2015 Clendenning et al.
2015/0217330 A1 8/2015 Haukka et al.
2015/0240121 A1 8/2015 Sugita et al.
2015/0275355 A1 10/2015 Mallikarjunan et al.
2015/0299848 A1 * 10/2015 Haukka ................... C23C 16/06 427/256
2015/0371866 A1 12/2015 Chen et al.
2015/0372205 A1 12/2015 Kimura et al.
2015/0376211 A1 12/2015 Girard et al.
2016/0005731 A1 1/2016 Chen
2016/0075884 A1 3/2016 Chen
2016/0079524 A1 3/2016 Do et al.
2016/0086850 A1 3/2016 Romero et al.
2016/0152640 A1 6/2016 Kuchenbeiser et al.
2016/0172189 A1 6/2016 Tapily
2016/0186004 A1 6/2016 Hustad et al.
2016/0190060 A1 6/2016 Bristol et al.
2016/0222504 A1 8/2016 Haukka et al.
2016/0247695 A1 8/2016 Niskanen et al.
2016/0276208 A1 9/2016 Haukka et al.
2016/0284568 A1 9/2016 Morris et al.
2016/0293384 A1 10/2016 Yan et al.
2016/0293398 A1 10/2016 Danek et al.
2016/0315191 A1 10/2016 Tsai et al.
2016/0346838 A1 12/2016 Fujita et al.
2016/0365280 A1 12/2016 Brink et al.
2017/0029948 A1 * 2/2017 Jongbloed ............. C23C 16/458
2017/0037513 A1 2/2017 Haukka et al.
2017/0040164 A1 2/2017 Wang et al.
2017/0051405 A1 2/2017 Fukazawa et al.
2017/0058401 A1 3/2017 Blackwell et al.
2017/0069527 A1 3/2017 Haukka et al.
2017/0100742 A1 4/2017 Pore et al.
2017/0100743 A1 4/2017 Pore et al.
2017/0107413 A1 4/2017 Wang et al.

(56) References Cited

U.S. PATENT DOCUMENTS

2017/0154806 A1 6/2017 Wang et al.
2017/0298503 A1 10/2017 Maes et al.
2017/0301542 A1 10/2017 Maes et al.
2017/0323776 A1 11/2017 Färm et al.
2017/0332179 A1 11/2017 Bright et al.
2017/0352533 A1 12/2017 Tois et al.
2017/0352550 A1 12/2017 Tois et al.
2017/0358482 A1 12/2017 Chen et al.
2018/0010247 A1 1/2018 Niskanen et al.
2018/0040708 A1 2/2018 Narayanan et al.
2018/0073136 A1 3/2018 Haukka et al.
2018/0080121 A1 3/2018 Longrie et al.
2018/0096888 A1 4/2018 Naik et al.
2018/0142348 A1 5/2018 Yu et al.
2018/0151345 A1 5/2018 Haukka et al.
2018/0151355 A1 5/2018 Fukazawa
2018/0166379 A1* 6/2018 Yeo .................. H01L 21/76831
2018/0182618 A1 6/2018 Blanquart et al.
2018/0211833 A1 7/2018 Li et al.
2018/0218914 A1 8/2018 Basu et al.
2018/0222933 A1 8/2018 Romero
2018/0233350 A1 8/2018 Tois et al.
2018/0243787 A1 8/2018 Haukka et al.
2018/0254179 A1* 9/2018 Chan ................ H01L 21/76829
2018/0350587 A1 12/2018 Jia et al.
2019/0017170 A1 1/2019 Sharma et al.
2019/0057858 A1 2/2019 Hausmann et al.
2019/0074441 A1 3/2019 Kikuchi et al.
2019/0100837 A1 4/2019 Haukka et al.
2019/0109009 A1* 4/2019 Longrie ............ H01L 21/32051
2019/0155159 A1 5/2019 Knaepen et al.
2019/0283077 A1 9/2019 Pore et al.
2019/0287807 A1 9/2019 Basu et al.
2019/0319007 A1* 10/2019 Uzoh ...................... H01L 24/30
2019/0333761 A1 10/2019 Tois et al.
2019/0341245 A1 11/2019 Tois et al.
2020/0051829 A1 2/2020 Tois et al.
2020/0090924 A1 3/2020 Wu et al.
2020/0105515 A1 4/2020 Maes et al.
2020/0122191 A1 4/2020 Haukka et al.
2020/0325573 A1 10/2020 Illiberi et al.
2020/0395211 A1 12/2020 Jia et al.
2021/0115559 A1 4/2021 Sharma et al.
2021/0118669 A1 4/2021 Tois et al.
2021/0358739 A1 11/2021 Tois et al.
2022/0349059 A1 11/2022 Sharma et al.
2023/0016537 A1 1/2023 Tois et al.

FOREIGN PATENT DOCUMENTS

EP 0469456 2/1992
EP 0880168 11/1998
EP 1340269 2/2009
EP 3026055 6/2016
JP 2001-127068 5/2001
JP 2008-311603 12/2008
JP 2011-018742 1/2011
JP 2011-187583 9/2011
JP 2014-093331 5/2014
KR 10-2001-001072 2/2001
KR 10-2002-0010821 2/2002
KR 2003-0027392 4/2003
KR 10-2004-0056026 6/2004
KR 10-2005-0103811 11/2005
KR 10-0920033 10/2009
KR 10-2010-0093859 8/2010
KR 10-2020-0120872 10/2020
KR 10-2197048 12/2020
TW 2005-39321 12/2005
TW 2010-05827 2/2010
TW 2010-27766 7/2010
TW 2014-39365 10/2014
TW 201833362 A 9/2018
TW 201835367 A 10/2018
TW 1652734 3/2019
TW 201908506 A 3/2019
TW 201947054 A 12/2019
WO WO 2002/045167 6/2002
WO WO 2011/156705 12/2011
WO WO 2013/161772 10/2013
WO WO 2014/156782 10/2014
WO WO 2014/209390 12/2014
WO WO 2015/047345 4/2015
WO WO 2015/094305 6/2015
WO WO 2015/147843 10/2015
WO WO 2015/147858 10/2015
WO WO 2016/178978 11/2016
WO WO 2017/184357 10/2017
WO WO 2017/184358 10/2017
WO WO 2018/204709 11/2018
WO WO 2018/213018 11/2018

OTHER PUBLICATIONS

Hashemi, Fatemeh Sadat Minaye, et al., "A New Resist for Area Selective Atomic and Molecular Layer Deposition on Metal-Dielectric Patterns". The Journal of Physical Chemistry C, 2014, 118, 10957-10962.*

Parsons, Gregory N., et al., "Area-Selective Deposition: Fundamentals, Applications, and Future Outlook". Chemistry of Materials, 2020 32 (12), 4920-4953.*

Pattison, Thomas G., et al., "Surface Initiated Polymer Thin Films for the Area Selective Deposition and Etching of Metal Oxides". ACS Nano 2020, 14, 4276-4288.*

Aaltonen et al., "Atomic Layer Deposition of Iridium Thin Films", Journal of The Electrochemical Society, 151 (8) G489-G492 (2004).

Atanasov et al., "Inherent substrate-dependent growth initation and selective-area atomic layer deposition of TiO2 using "water-free" metal-halide/metal alkoxide reactants", J. Vac. Sci. Technol. A 34(1), Jan./Feb. 2016, pp. 01A148-1-01A148-9.

Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.

Benzotriazole, Wikipedia via https://en.wikipedia.org/wiki/Benzotriazole; pp. 1-5, no date available.

Bernal-Ramos, et al., "Atomic Layer Deposition of Cobalt Silicide Thin Films Studied by in Situ Infrared Spectroscopy", Chem. Mater. 2015, 27, pp. 4943-4949.

Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.

Burton et al., "Atomic Layer Deposition of MgO Using Bis(ethylcyclopentadienyl)magnesium and H2O". J. Phys. Chem. C, 2009, 113, 1939-1946.

Burton et al., "Rapid SiO2 Atomic Layer Deposition Using Tris(tert-pentoxy)silanol", Chem. Mater. 2008, 20, pp. 7031-7043.

Burton et al. "SiO2 Atomic Layer Deposition Using Tris(dimethylamino)silane and Hydrogen Peroxide Studied by in Situ Transmission FTIR Spectroscopy". J. Phys. Chem. C, 2009, 113, 8249-8257.

Cai et al.,"Selective Passivation of Pt Nanoparticles with Enhanced Sintering Resistance and Activity toward CO Oxidation via Atomic Layer Deposition", ACS Appl. Nano Mater. 2018, 1, 2, pp. 522-530.

Carlsson, J., "Precursor Design for Chemical Vapour Deposition", Acta Chemica Scandinavica, vol. 45, 1991, pp. 864-869.

Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.

Chen et al., "Highly Stable Monolayer Resists for Atomic Layer Deposition on Germanium and Silicon", Chem. Matter, vol. 18, No. 16, pp. 3733-3741, 2006.

Cho et al., "Atomic layer deposition of Al2O3 thin films using dimethylaluminum isopropoxide and water", Journal of Vacuum Science & Technology A 21, (2003), doi: 10.1116/1.1562184, pp. 1366-1370.

(56) References Cited

OTHER PUBLICATIONS

Choi et al., "Rapid vapor deposition SiO2 thin film deposited at a low temperature using tris(tert-pentoxy)silanol and trimethyl-aluminum", Materials Chemistry and Physics, 142 (2013), pp. 614-618.
Coclite, et al.; 25th Anniversary Article: CVD Polymers: A New Paradigm for Surface Modification and Device Fabrication; Advanced Materials; Oct. 2013; 25; pp. 5392-5423.
Elam et al., "Kinetics of the WF6 and Si2H6 surface reactions during tungsten atomic layer deposition", Surface Science, vol. 479, 2001, pp. 121-135.
Elam et al., "Nucleation and growth during tungsten atomic layer deposition on SiO2 surfaces", Thin Solid Films, vol. 386, 2001 pp. 41-52.
Ellinger et al., "Selective Area Spatial Atomic Layer Deposition of ZnO, Al2O3, and Aluminum-Doped ZnO Using Poly(vinyl pyrrolidone)", Chem. Mater. 2014, 26, pp. 1514-1522.
Fabreguette et al., Quartz crystal microbalance study of tungsten atomic layer deposition using WF6 and Si2H6, Thin Solid Films, vol. 488, 2005, pp. 103-110.
Farm et al., "Self-Assembled Octadecyltrimethoxysilane Monolayers Enabling Selective-Area Atomic Layer Deposition of Iridium", Chem. Vap. Deposition, 2006, 12, pp. 415-417.
Farm et al. "Selective-Area Atomic Layer Deposition Using Poly( methyl methacrylate) Films as Mask Layers", J. Phys. Chem. C, 2008, 112, pp. 15791-15795. (Year: 2008).
Farr, "Synthesis and Characterization of Novel Polyimide Gas Separation Membrane Material Systems", Chapter 2; Virginia Tech Chemistry PhD Dissertation; URN# etd-080999-123034; Jul. 26, 1999.
File History of U.S. Appl. No. 13/702,992, filed Mar. 26, 2013.
File History of U.S. Appl. No. 14/613,183, filed Feb. 3, 2015.
File History of U.S. Appl. No. 14/988,374, filed Jan. 5, 2016.
File History of U.S. Appl. No. 15/609,497, filed May 31, 2017.
File History of U.S. Appl. No. 16/100,581, filed Aug. 10, 2018.
File History of U.S. Appl. No. 13/708,863, filed Dec. 7, 2012.
File History of U.S. Appl. No. 14/737,293, filed Jun. 11, 2015.
File History of U.S. Appl. No. 15/356,306, filed Nov. 18, 2016.
File History of U.S. Appl. No. 16/213,479, filed Dec. 7, 2018.
File History of U.S. Appl. No. 14/612,784, filed Feb. 3, 2015.
File History of U.S. Appl. No. 15/877,632, filed Jan. 23, 2018.
File History of U.S. Appl. No. 16/657,307, filed Oct. 18, 2019.
File History of U.S. Appl. No. 14/687,833, filed Apr. 15, 2015.
File History of U.S. Appl. No. 16/100,855, filed Aug. 10, 2018.
File History of U.S. Appl. No. 16/594,365, filed Oct. 7, 2019.
File History of U.S. Appl. No. 14/628,799, filed Feb. 23, 2015.
File History of U.S. Appl. No. 15/331,366, filed Oct. 21, 2016.
File History of U.S. Appl. No. 16/143,888, filed Sep. 27, 2018.
File History of U.S. Appl. No. 16/987,990, filed Aug. 7, 2020.
File History of U.S. Appl. No. 14/817,161, filed Aug. 3, 2015.
File History of U.S. Appl. No. 14/819,274, filed Aug. 5, 2015.
File History of U.S. Appl. No. 16/787,672, filed Feb. 11, 2020.
File History of U.S. Appl. No. 15/432,263, filed Feb. 14, 2017.
File History of U.S. Appl. No. 16/158,780, filed Oct. 12, 2018.
File History of U.S. Appl. No. 16/773,064, filed Jan. 27, 2020.
File History of U.S. Appl. No. 15/221,453, filed Jul. 27, 2016.
File History of U.S. Appl. No. 16/575,112, filed Sep. 18, 2019.
File History of U.S. Appl. No. 15/177,195, filed Jun. 8, 2016.
File History of U.S. Appl. No. 15/795,768, filed Oct. 27, 2017.
File History of U.S. Appl. No. 16/040,844, filed Jul. 20, 2018.
File History of U.S. Appl. No. 16/676,017, filed Nov. 6, 2019.
File History of U.S. Appl. No. 15/581,726, filed Apr. 28, 2017.
File History of U.S. Appl. No. 15/364,024, filed Nov. 29, 2016.
File History of U.S. Appl. No. 15/892,728, filed Feb. 9, 2018.
File History of U.S. Appl. No. 16/605,475, filed Oct. 15, 2019.
File History of U.S. Appl. No. 16/033,952, filed Jul. 12, 2018.
File History of U.S. Appl. No. 17/135,001, filed Dec. 28, 2020.
File History of U.S. Appl. No. 16/399,328, filed Apr. 30, 2019.
File History of U.S. Appl. No. 17/113,383, filed Dec. 7, 2020.
File History of U.S. Appl. No. 15/971,601, filed May 4, 2018.
File History of U.S. Appl. No. 16/588,600, filed Sep. 30, 2019.
File History of U.S. Appl. No. 16/836,151, filed Mar. 31, 2020.
File History of U.S. Appl. No. 17/064,865, filed Oct. 7, 2020.
Formic Acid, Wikipedia via https://en.wikipedia.org/wiki/Formic_acid; pp. 1-5, no date available.
George, "Atomic layer deposition: An overview", Chem. Rev. 2010, 110 pp. 111-131, Feb. 12, 2009.
Ghosal et al., "Controlling Atomic Layer Deposition of TiO2 in Aerogels through Surface Functionalization", Chem. Matter, vol. 21, pp. 1989-1992, 2009.
Grubbs et al., "Nucleation and growth during the atomic layer deposition of W on Al2O3 and Al2O3 on W", Thin Solid Films, vol. 467, 2004, pp. 16-27.
Hashemi et al., "A New Resist for Area Selective Atomic and Molecular Layer Deposition on Metal-Dielectric Patterns", J. Phys. Chem. C 2014, 118, pp. 10957-10962.
Hashemi et al., "Selective Deposition of Dieletrics: Limits and Advantages of Alkanethiol Blocking Agents on Metal-Dielectric Patterns", ACS Appl. Mater. Interfaces 2016, 8, pp. 33264-33272.
Hausmann et al., "Rapid Vapor Deposition of Highly Conformal Silica Nanolaminates", Science, vol. 298, Oct. 11, 2002, pp. 402-406.
Hu et al. "Coating strategies for atomic layer deposition", Nanotechnol. Rev. 2017; 6(6): pp. 527-547.
Hymes et al., "Surface cleaning of copper by thermal and plasma treatment in reducing and inert ambients", J. Vac. Sci. Technol. B, vol. 16, No. 3, May/Jun. 1998, pp. 1107-1109.
Jin et al., "Lanthanide metal-assisted synthesis of rhombic dodecahedral Mni (M = Ir and Pt) nanoframes toward efficient oxygen evolution catalysis", Nano Energy 42, 2017, pp. 17-25.
King, "Dielectric Barrier, Etch Stop, and Metal Capping Materials for State of the Art and beyond Metal Interconnects", ECS Journal of Solid State Science and Technology, vol. 4, Issue 1, pp. N3029-N3047, 2015.
Klaus et al., "Atomic layer deposition of tungsten using sequential surface chemistry with a sacrificial stripping reaction", Thin Solid Films, vol. 360, 2000, pp. 145-153.
Klaus et al., "Atomically controlled growth of tungsten and tungsten nitride using sequential surface reactions", Applied Surface Science 162-163, 2000, pp. 479-491.
Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.
Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, pp. 031605-1-031605-8.
Lee et al., "Area-Selective Atomic Layor Deposition Using Self-Assembled Monolayer and Scanning Probe Lithography", Journal of The Electrochemical Society, vol. 156, Issue 9, pp. G125-G128, 2009.
Lei et al., "Real-time observation and opitimization of tungsten atomic layer deposition process cycle", J. Vac. Sci. Technol. B, vol. 24, No. 2, Mar./Apr. 2006, pp. 780-789.
Lemonds, "Atomic Layer Deposition and Properties of Refractory Transition Metal-Based Copper-Diffusion Barriers for ULSI Interconnect", The University of Texas at Austin, 2003, pp. 1-197.
Lemonds, A.M., "Atomic layer deposition of TaSix thin films on SiO2 using TaF5 and Si2H6", Thin Solid Films 488, 2005 pp. 9-14.
Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.
Liang et al., "Growth of Ge Nanofilms Using Electrochemical Atomic Layer Deposition, with a "Bait and Switch" Surface-Limited Reaction". Journal of American Chemical Society, 2011, 133, 8199-8024.
Lin et al., "Selective Deposition of Multiple Sensing Materials on Si Nanobelt Devices through Plasma-Enhanced Chemical Vapor Deposition and Device-Localized Joule Heating", ACS Appl. Mater. Interfaces 2017, 9, 39935-39939, DOI: 10.1021/acsami.7b13896.

(56) References Cited

OTHER PUBLICATIONS

Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., "Selective deposition of CVD iron on silicon dioxide and tungsten", Microelectronic Engineering 83, pp. 2229-2233, 2006.
Mackus et al., "Influence of Oxygen Exposure on the Nucleation of Platinum Atomic Layer Deposition: Consequences for Film Growth", Nanopatterning, and Nanoparticle Synthesis, Chem. Matter, vol. 25, pp. 1905-1911, 2013.
Mackus et al., "Local deposition of high-purity Pt nanostructures by combining electron beam induced deposition and atomic layer deposition", Journal of Applied Physics, vol. 107, pp. 116102-1-116102-3, 2010.
Mackus et al., "The use of atomic layer deposition in advanced nanopatterning", Nanoscale, 2014, 6, pp. 10941-10960.
Maluf et al., "Selective tungsten filling of sub-0.25μm trenches for the fabrication of scaled contacts and x-ray masks", J. Vac. Sci. Technol. B, vol. 8, No. 3, May/Jun. 1990, pp. 568-569.
Mameli et al., Area-Selective Atomic Layer Deposition of SiO2 Using Acetylacetone as a Chemoselective Inhibitor in an ABC-Type Cycle, ACS Nano, Aug. 29, 2017, 9303-9311, 11, 9, American Chemical Society.
Norrman, et al.; 6 Studies Of Spin-Coated Polymer Films; Annu. Rep. Prag. Chem.; Sect. C; 2005; 101; pp. 174-201.
Overhage et al., "Selective Atomic Layer Deposition (SALD) of Titanium Dioxide on Silicon and Copper Patterned Substrates", Journal of Undergraduate Research 4, 29, Mar. 2011 in 4 pages.
Parsons et al., "Area-Selective Deposition: Fundamentals, Applications, and Future Outlook", Chemistry of Materials, 2020, 32, 12, pp. 4920-4953.
Parulekar et al., "Atomic Layer Deposition of Zirconium Oxide on Copper Patterned Silicon Substrate", Journal of Undergraduate Research, vol. 7, pp. 15-17, 2014.
Parulekar et al., "Selective atomic layer deposition of zirconium oxide on copper patterned silicon substrate", pp. 1-6, 2013.
Prasittichai et al., "Area Selective Molecular Layer Deposition of Polyurea Film", Applied Materials & Interfaces, 2013, vol. 5, pp. 13391-13396.
Priimagi et al., "The Halogen Bond in the Design of Functional Supramolecular Materials: Recent Advances", Accounts of Chemical Research, 2013, vol. 46, No. 11, pp. 2686-2695.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition Of Polyimide Thin Films; Journal of Materials Chemistry; 2007, 17, pp. 664-669.
Ratta, Varun; Crystallization, Morphology, Thermal Stability and Adhesive Properties of Novel HighPerformance Semicrystalline Polyimides, Chapter 1; Virginia Tech Chemistry PhD Dissertation; URN # etd-051799-162256; Apr. 26, 1999.
Roberts et al., "Selective Mn deposition on Cu lines", poster presentation, 12th International Conference on Atomic Layer Deposition, Jun. 19, 2012, Dresden, Germany.
Sapp, et al.; Thermo-Mechanical and Electrical Characterization of Through-Silicon Vias with a Vapor Deposited Polyimide Dielectric Liner; IEEE; 2012.
Schmeißer, "Decomposition of formic acid", Chemnitz University of Technology, pp. 1-13, Aug. 31, 2011.
Schmeißer, "Reduction of Copper Oxide by Formic Acid an ab-initio study", Chemnitz University of Technology, pp. 1-42, Sep. 2011.
Schuiskly et al., "Atomic Layer Deposition of Thin Films Using O2 as Oxygen Source", Langmuir, vol. 17, No. 18, 2001, pp. 5508-5512.
Selvaraj et al., "Selective atomic layer deposition of zirconia on copper patterned silicon substrates using ethanol as oxygen source as well as copper reductant", Journal of Vacuum Science & Technology A, vol. 32, No. 1, pp. 010601-1-010601-4, Jan. 2014.
Senesky et al., "Aluminum nitride as a masking material for the plasma etching of silicon carbide structures," 2010, IEEE, pp. 352-355.
Singh et al, "Area-Selective Atomic Layer Deposition of Metal Oxides on Noble Metals through Catalytic Oxygen Activation", Chem. Mater. 2018, 30, pp. 663-670.
Soethoudt et al,"Impact of SiO2 surface composition on trimethylsilane passivation for area-selective deposition", J. Mater. Chem. C, 2019, 7, pp. 11911-11918.
Sundberg, et al.; Organic And Inorganic-Organic Thin Film Structures By Molecular Layer Deposition: A Review; Beilstein J. Nanotechnol; 2014, 5, pp. 1104-1136.
Suntola, Tuomo, "Thin Films and Epitaxy Part B: Grown mechanism and Dynamics", Handbook of Crystal Growth vol. 3, Elsevier, 1994, 33 pages.
Ting, et al., "Selective Electroless Metal Deposition for Integrated Circuit Fabrication", J. Electrochem. Soc., vol. 136, No. 2, Feb. 1989, pp. 456-462.
Toirov et al., "Thermal Cyclodehydration of Polyamic Acid Initiated by UV-Irradiation", Iranian Polymer Journal; vol. 5, No. 1; pp. 16-22; 1996; Iran.
Tomczak, Y., In Situ Reaction Mechanism Studies on Atomic Layer Deposition of AlxSiyOz from Trimethylaluminium, Hexakis(ethylamino)disilane, and Water, Chem. Mater., Oct. 12, 2012, 3859-3867, 24, American Chemical Society.
"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.
Vallat et al., "Selective deposition of Ta205 by adding plasma etching super-cycles in plasma enhanced atomic layer deposition steps", Journal of Vacuum Science & Technology A, vol. 35, No. 1, pp. 01B104-1-01B104-7, Jan. 2017.
Vervuurt et al., "Area-selective atomic layer deposition of platinum using photosensitive polyimide", Nanotechnology 27, 2016, in 6 pages.
Wang et al., "Low-temperature plasma-enhanced atomic layer deposition of tin oxide electron selective layers for highly efficient planar perovskite solar cells", Journal of Materials Chemistry A, 2016, 4, pp. 12080-12087.
Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.
Zhou, et al., Fabrication of Organic Interfacial Layers By Molecular Layer Deposition: Present Status And Future Opportunities; Journal of Vacuum Science & Technology; A 31 (4), 040801-1 to 040801-18; 2013.

* cited by examiner

SIMULTANEOUS SELECTIVE DEPOSITION OF TWO DIFFERENT MATERIALS ON TWO DIFFERENT SURFACES

REFERENCE TO RELATED APPLICATION

This application is a continuation of U.S. application Ser. No. 17/216,260, filed Mar. 29, 2021 (now U.S. Pat. No. 11,608,557), which claims priority to U.S. Provisional Application No. 63/001,898, filed on Mar. 30, 2020, which is incorporated by reference herein in its entirety.

BACKGROUND

Field

This application relates to simultaneous selective deposition of two different materials on two different surfaces of a same substrate. In particular, it relates to a vapor deposition process in which exposure of two different surfaces to the same vapor phase reactants selectively deposits two different materials on the two different surfaces.

Description of the Related Art

Integrated circuits are currently manufactured by an elaborate process in which various layers of materials are sequentially constructed in a predetermined arrangement on a semiconductor substrate.

The predetermined arrangement of materials on a semiconductor substrate is often accomplished by deposition of a material over the entire substrate surface, followed by removal of the material from predetermined areas of the substrate, such as by deposition of a mask layer and subsequent selective etching process. Thus, multiple steps are typically required when it is desired that a first material is to be deposited on only a first surface and a second material is to be deposited on only a second surface. First, a first material is deposited over the entire substrate surface. Then a photolithography process is used to pattern the first material exposing the first material not on the first surface. The first surface is then etched such that what remains is the first material on the first surface. The same steps are then followed to produce the second material on the second surface.

It would be beneficial to have one process which simultaneously and selectively deposits a first material on a first surface of a substrate and a second material on a second surface of the substrate. Such a process could save manufacturing time by avoiding the need for separate steps for depositing and etching each of the first material and the second material.

SUMMARY

In some aspects, methods of selectively depositing a first material on a first surface of a substrate and a second, different material on a second, different surface of the substrate are provided. The methods of selectively depositing a first material on a first surface of a substrate and a second, different material on a second, different surface of the substrate may comprise one or more first deposition cycles comprising: exposing the first and second surfaces of the substrate to a passivation agent, such that the passivation agent selectively forms a passivation layer on the first surface relative to the second surface; exposing the first and second surfaces of the substrate to a first metal or semimetal reactant; and exposing the first and second surfaces of the substrate to a second metal or semimetal reactant. In some embodiments, a first layer of a first material comprising a first metal or semimetal from the first metal or semimetal reactant and a second metal or semimetal from the second metal or semimetal reactant is formed on the second surface and not on the first surface. In some embodiments, a second layer of a second material comprising the second metal or semimetal from the second metal or semimetal reactant is formed on the first surface and not on the second surface.

In some embodiments, the first surface comprises a metal and the second surface comprises a dielectric material. In some embodiments, the metal is Co, Cu, W, Ru and/or Ni. In some embodiments, the dielectric material comprises silicon dioxide ($SiO_2$), silicon nitride (SiN), and/or silicon oxide carbide (SiOC). In some embodiments, the first material has different material properties from the second material. In some embodiments, the first material has a different etch rate from the second material. In some embodiments, the first material has a different conductivity or refractive index from the second material.

In some embodiments, the methods of selectively depositing a first material on a first surface of a substrate and a second, different material on a second, different surface of the substrate may additionally comprise contacting the first and second surfaces with an additional reactant. The additional reactant may be, for example, an oxygen reactant, a nitrogen reactant or a carbon reactant. In some embodiments, the first surface is a metal surface, the second surface is a dielectric surface, the passivation agent is Hthd, Hfac or Hacac, the first metal or semimetal reactant is diethylaminosilane or hexakis(ethylamino)disilane, the second metal or semimetal reactant is trimethyl aluminum (TMA) and the additional reactant is an oxygen reactant comprising water.

In some embodiments, the methods of selectively depositing a first material on a first surface of a substrate and a second, different material on a second, different surface of the substrate additionally comprise one or more second deposition cycles comprising alternately and sequentially contacting the substrate with the passivation agent and the first metal or semimetal reactant. In some embodiments, the one or more second deposition cycles additionally comprise contacting the substrate with an oxygen reactant, nitrogen reactant and/or carbon reactant. In some embodiments, the first cycle is repeated X times and second cycle is repeated Y times, where X and Y are integers.

In some embodiments, the passivation agent comprises a di-imine or a beta-diketonate. In some embodiments, the passivation layer sterically prevents the first metal or semimetal reactant from reacting with the first surface. In some embodiments, the first metal or semimetal reactant comprises silicon. In some embodiments, the first metal or semimetal reactant comprises hexamethyldisilazane (HMDS), tetramethyldisilazane (TMDS), diethylaminosilane and/or hexakis(ethylamino)disilane. In some embodiments, the second metal or semimetal reactant comprises aluminum, zirconium, hafnium, titanium, lanthanum, and/or erbium.

In some embodiments, methods of depositing two different materials on a substrate are provided. The methods of depositing two different materials on a substrate comprise selectively and simultaneously depositing a first material on a first surface of a substrate and a second, different material on a second, different surface of the substrate by simultaneously contacting the first surface and second surface of the substrate with sequential pulses of the same vapor-phase reactants. In some embodiments, the methods of depositing two different materials on a substrate further comprise: exposing the first and second surfaces to a passivation agent, such that the passivation agent selectively forms a passivation layer on the first surface relative to the second surface; exposing the first and second surfaces to a first reactant, wherein the first reactant comprises a metal or semimetal; and exposing the first and second surfaces to a second reactant, wherein the second reactant comprises a metal or semimetal. In some embodiments, the passivation agent comprises a beta-diketonate. In some embodiments, the first reactant comprises HMDS, TMDS, diethylaminosilane, and/or hexakis(ethylamino)disilane. In some embodiments, the second reactant comprises aluminum, zirconium, hafnium, titanium, lanthanum, and/or erbium. In some embodiments, selectively depositing the first material and the second material is performed without exposure to ambient air.

DETAILED DESCRIPTION

Figure 1:
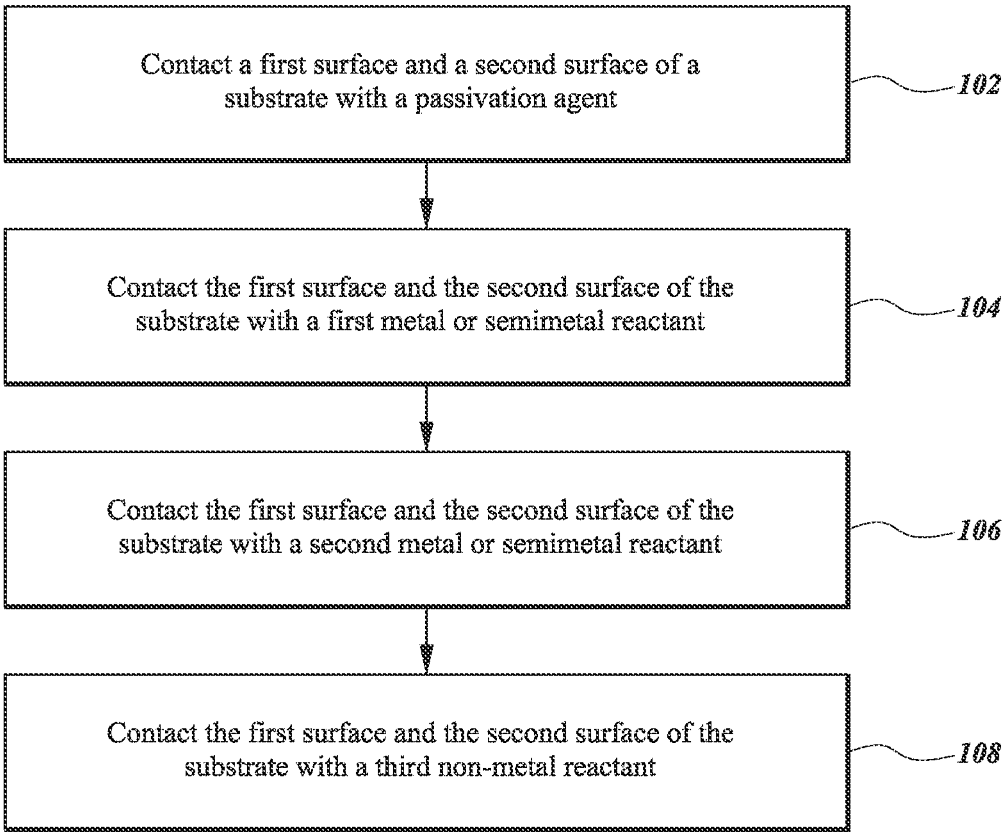
FIG. 1 is a flowchart that illustrates an exemplary embodiment of a process that simultaneously and selectively deposits two materials on two different surfaces of a substrate.

In some situations, such as in the formation of integrated circuits, it is desirable to selectively form a first material on a first surface and a second, different material on a second, different surface of a substrate. Doing so with a single vapor deposition process, as described herein, may provide a number of advantages, including, for example, increasing the speed of processing by avoiding many of the typical processing steps. In some embodiments the first material that is deposited can have one or more different material properties from the second material, and these differences can be taken advantage of in subsequent processing. For example, such material properties can include different etch rates and different conductivities.

Methods and materials for simultaneously and selectively depositing a first material on a first surface of a substrate and a second material on a second surface of the substrate using a single deposition process are disclosed herein. The first and second material are different from each other and have different material properties. In some embodiments vapor deposition processes are provided in which a substrate comprising layers of two different materials, such as a dielectric material and a metal, is exposed to multiple different precursors, reactants and/or passivation agents. At least one of the different reactants reacts differentially with the surfaces of the two different layers on the substrate. For example, in some embodiments a first surface of a substrate, such as a surface of a metal layer, and a second surface of the substrate, such as a surface of a layer comprising a dielectric material, are sequentially exposed to a passivation agent, a first metal or semimetal reactant, and a second metal or semimetal reactant. In some embodiments a third reactant can also be alternately and sequentially provided to produce the desired materials. For example, a third reactant may be an oxygen reactant, a nitrogen reactant or a carbon reactant that reacts with the deposited material to produce an oxide, nitride or carbide. In some embodiments the first surface and second surface are adjacent to each other on the substrate.

The passivation agent selectively reacts with the first surface relative to the second surface and preferentially forms a layer of passivating species on the first surface. For example, in some embodiments a passivation agent selectively forms a passivation layer on a metal surface of a substrate relative to a dielectric surface. As a result of the passivation of the first surface, the first metal or semimetal reactant reacts with the second, non-passivated surface but not the passivated first surface, forming a layer of reactant species comprising the metal or semimetal of the first metal or semimetal reactant on the second surface. In some embodiments, there is substantially no reactant species comprising the metal or semimetal of the first metal or semimetal reactant on the first surface. Without being limited by theory, this may be due to steric hindrance caused by the passivation agent that prevents the first metal or semimetal reactant from contacting and reacting with the first surface.

The second metal or semimetal reactant is not prevented from reacting by the passivation layer and thus reacts with both the first and second surfaces. For example, the second metal or semimetal reactant may be of a size that is not sterically prevented from contacting the first surface despite the presence of the passivation layer. Thus, a layer of reactant species comprising the metal or semimetal of the second metal or semimetal reactant is formed on the first surface. Further, the second metal or semimetal reactant also reacts with the second surface, forming a layer of species on the second surface comprising both the metal or semimetal from the first metal or semimetal reactant and the metal or semimetal from the second metal or semimetal reactant.

Similarly, the optional third reactant is able to react with both the first passivated surface and the second non-passivated surface. As a result, the third reactant reacts with the species on the first surface to form a first material comprising a metal or semimetal from the second metal or semimetal reactant on the first surface, and the third reactant reacts with the species on the second surface to form a second, different material comprising a first metal or semimetal from the first metal or semimetal reactant and a second metal or semimetal from the second metal or semimetal reactant on the second surface. The first material and the second material are thus different materials and can have one or more different material properties, such as etch rate, density, conductivity, and refractive index.

In some embodiments a substrate comprising a first surface of a first material layer and a second surface of a second, different material layer, such as a first metal surface and a second dielectric surface, is provided. In some embodiments, for example, the substrate may comprise a metal surface comprising Co, Cu or W and a dielectric surface comprising $SiO_2$.

In some embodiments, the first surface comprises, consists essentially of, or consists of a metal oxide, such as hafnium oxide, titanium oxide, aluminum oxide, molybdenum oxide, cobalt oxide, or copper oxide, whereas the second surface comprises, consists essentially of, or consists of a different metal or a metal oxide, such as germanium oxide, tungsten oxide, zinc oxide, iron oxide, metallic ruthenium or metallic platinum.

In some embodiments, the first surface comprises, consists essentially of, or consists of a metal oxide, such as hafnium oxide, titanium oxide, aluminum oxide, molybdenum oxide, cobalt oxide, or copper oxide, whereas the second surface comprises, consists essentially of, or consists of silicon oxide, silicon nitride or metallic palladium.

In some embodiments, the first surface comprises, consists essentially of, or consists of a metal or a metal oxide, such as germanium oxide, tungsten oxide, zinc oxide, iron oxide, metallic ruthenium or metallic platinum, whereas the second surface comprises, consists essentially of, or consists of silicon oxide, silicon nitride or metallic palladium.

The two different surfaces of the substrate are alternately and sequentially exposed to a passivation agent, a first metal or semimetal reactant, a second metal or semimetal reactant and a third reactant, such as an oxidizing agent. The passivation agent selectively reacts with the first surface relative to the second surface, such as a first metal surface relative to a second dielectric surface, and preferentially forms a layer of passivating species on the first surface. Following passivation, the first and second surfaces of the substrate are exposed to the first metal or semimetal reactant. As a result of the passivation of the first surface, the first metal or semimetal reactant reacts with the non-passivated first second surface but not the passivated second first surface to form a layer comprising the metal or semimetal of the first metal or semimetal reactant on the second surface. For example, a layer comprising the metal or semimetal of the first metal or semimetal reactant may be formed on the second dielectric surface relative to the passivated first metal surface.

The first and second surfaces are subsequently exposed to the second metal or semimetal reactant. The second metal or semimetal reactant is not prevented from reacting by the passivation layer and thus when the substrate is contacted with the second metal or semimetal reactant it reacts with both the first second surface comprising a layer of metal or semimetal species from the first metal or semimetal reactant, and the second first passivated surface. As a result, the second surface comprises both a metal or semimetal from the first metal or semimetal reactant and a metal or semimetal from the second metal or semimetal reactant, while the first surface comprises only a metal or semimetal from the second metal or semimetal reactant. For example, a first material comprising a metal or semimetal from the first second metal or semimetal reactant may be formed on the first metal surface, and a second, different material comprising a first metal or semimetal from the first metal or semimetal reactant and a second metal or semimetal from the second metal or semimetal reactant is formed on the second dielectric surface.

The first and second surfaces are optionally further contacted with a third reactant. The third reactant is not prevented from reacting by the passivation agent and thus reacts with the first material and second material, such as by forming respective oxides, nitrides or carbides. Additional reactants can be provided to achieve the desired material composition. The resulting first material and the second material are thus different materials and can have one or more different material properties, such as etch rate, density, conductivity, and refractive index. In some embodiments, one or more additional reactants can be provided to achieve the desired material composition and characteristics of each of the first and second materials.

In some embodiments the first material and the second material may have an etch rate that differs by at least 25%, at least 50%, at least 75%, at least 85%, at least 90%, or at least 95%. The first material may have an etch rate that is at least 1.5 times, at least 2 times, at least 3 times, at least 5 times, at least 7 times, or at least 10 times of the etch rate of the second material.

In some embodiments the first material and the second material may have a conductivity that differs by at least 20%, at least 40%, at least 60%, at least 100%, or at least 500%. In some embodiments the first material may have a conductivity that is at least 10 times, at least 100 times, or at least 1000 times greater than the conductivity of the second material.

In some embodiments the first material and the second material may have a density that differs by at least 5%, at least 10%, at least 20%, at least 30%, at least 40%, or at least 50%.

In some embodiments the first material and the second material may have a refractive index that differs by at least 5%, at least 10%, at least 20%, at least 30%, at least 40%, or at least 50%.

In some embodiments one of the first and second materials may be removed selectively relative to the other of the first and second materials by etching. In some embodiments, one of the first material or second material is removed selectively by etching and the selectivity of the etch process between the first material and the second material may be at least 25%, at least 50%, at least 75%, at least 85%, at least 90%, or at least 95%. Selectivity of the etch process between a first material and a second material can be given as a percentage calculated by (etch rate of the first material/etch rate of the second material).

The alternate and sequential provision of the passivation agent, first metal or semimetal reactant, second metal or semimetal reactant, and third reactant can be considered a deposition cycle. The deposition cycle can be repeated multiple times to selectively deposit the two different materials on the two different surfaces at a desired thickness. In subsequent cycles, the passivation agent maintains its selectivity by reacting with the material formed on the first surface but not on the second surface. For example, if the passivation agent is initially selective for a metal surface relative to a dielectric surface, this selectivity will be maintained in subsequent deposition cycles even though the top surface of the dielectric has been changed by the initial deposition cycle. In some embodiments, for example, the passivation agent is selective for a metal oxide relative to a dielectric, and an initial metal surface comprises oxide or is treated to comprise some oxide. In subsequent cycles, a metal oxide is formed (possibly including a different metal) and selectivity is maintained. Similarly, the selectivity of the first, second and third reactants will be maintained in subsequent deposition cycles. Although referred to as the first, second and third reactants, the passivation agent, first metal or semimetal reactant, second semimetal or metal reactant and third reactant can be provided in any order. Further the order may vary between cycles.

As mentioned above, in some embodiments the passivation agent selectively passivates a first surface and not a second surface of a substrate. In some embodiments the passivation agent selectively passivates a metal surface relative to a dielectric surface. In some embodiments the passivation agent may sterically hinder the reaction of a first metal or semimetal reactant on the passivated first surface. However, because the second surface is not passivated, the second surface is able to react with the first metal or semimetal reactant. On the other hand, the passivation agent does not hinder the reaction of one or more additional reactants, such that those reactants are able to react with both the first and second surfaces. In this way, a first metal or semimetal reactant that is simultaneously exposed to the first and second surfaces selectively reacts with the second surface and not the first passivated surface, while a second metal or semimetal reactant and any additional reactants are then able to react with both the first passivated surface and second non-passivated surface, leading to formation of different materials on the first and second surfaces. Thus, passivation agents are chosen based on the specific circumstances such that they are able to selectively passivate a first surface relative to a second surface and such that they prevent reaction of a first precursor while allowing reaction of a second and optionally additional precursors. In some embodiments, the passivation agent is a bidentate compound comprising an ethylene or propane bridge between the heteroatoms. For example, the passivation agent may comprise O, S, N or P heteroatoms. In some embodiments, the passivation agent comprises a compound according to formula (I), formula (II), formula (III) or formula (IV), (I)

(II)

(III)

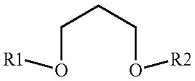

(IV)

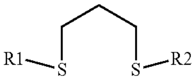

wherein R1 and R2 are independently selected from linear, branched, cyclic and aromatic C1 to C10 hydrocarbons.

In some embodiments, the passivation agent comprises a compound according to formula (V), formula (VI), formula (VII) or formula (VIII), (V)

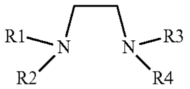

(VI)

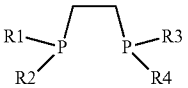

(VII)

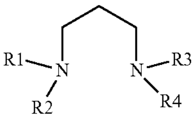

(VIII)

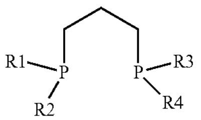

wherein each of R1, R2, R3 and R4 are independently selected from linear, branched, cyclic and aromatic C1 to C10 hydrocarbons.

In some embodiments, the passivation agent is a pyridine-based compound according to formula (IX), carbon monoxide, nitrilooxonium, a substituted butadiene according to formula (X), a tri-alkyl phosphine according to formula (XI), dialkyl sulfide according to formula (XII) or (XIII), or a disulfide according to formula (XIV), (IX)

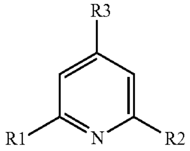

(X)

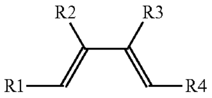

(XI)

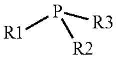

(XII)

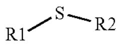

(XIII)

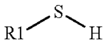

(XIV)

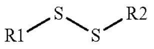

wherein each R1, R2, R3, and R4 may be independently selected from linear, branched, cyclic or aromatic C1 to C10 hydrocarbons.

In some embodiments, the passivation agent is a di-imine-based compound. The two imine groups of the di-imine-based compound may be positioned in adjacent carbon atoms (i.e. (R1-C(N—R3)—C(N—R4)—R2)). Alternatively, the imine groups may be separated by a carbon atom (i.e. R1-C(N—R3)—C—C(N—R4)—R2). The R1 and R2 groups of the di-imine-based compounds may be independently selected from linear, branched, cyclic or aromatic C1 to C10 hydrocarbons, from linear, branched, cyclic or aromatic C1-C10 alkoxy groups, from alkylamino groups, where the substituents on N are independently either H or alkyl, and where alkyl is linear, branched, cyclic or aromatic C1-C10, or from halocarbon groups comprising from 1 to 10 carbons and a halogen (F, Cl, Br or I), such as $—CF_3$ or $—CF_2CF_3$. In some embodiments, the passivation agent is a diketone-based compound. The two ketone groups of the diketone-based compound may be positioned in adjacent carbon atoms (i.e. (R1-C(O)—C(O)—R2)). Alternatively, the ketone groups may be separated by a carbon atom (i.e. R1-C(O)—C—C(O)—R2). The R1 and R2 groups of the diketone-based compounds may be independently selected from linear, branched, cyclic or aromatic C1 to C10 hydrocarbons, from linear, branched, cyclic or aromatic C1-C10 alkoxy groups, from alkylamino groups, where the substituents on N are independently either H or alkyl, and where alkyl is linear, branched, cyclic or aromatic C1-C10, or from halocarbon groups comprising from 1 to 10 carbons and a halogen (F, Cl, Br or I), such as $—CF_3$ or $—CF_2CF_3$. In some embodiments the passivation agent is a beta-diketonate. In some embodiments the passivation agent is tetramethyl-3,5-heptanedione (Hthd). In some embodiments the passivation agent is acetylacetone (Hacac). In some embodiments, the passivation agent is Hexafluoroacetylacetone (Hfac).

In some embodiments the first metal or semimetal precursor has a large molecular size which does not permit the first metal or semimetal reactant molecules to penetrate through the passivation layer and therefore the passivation agent keeps the first metal or semimetal precursor from contacting and reacting with the first surface. On the other hand, the second metal or semimetal precursor has a molecular size that allows it to penetrate through the passivation agent to react with the first surface. Beneficially, the passivated surface thus reacts only with the second metal or semimetal precursor while the non-passivated surface reacts with both of the first and second metal or semimetal precursors. Again, one or more additional reactants may be provided that are able to react with both surfaces, such as an oxygen-containing reactant that is able to react with the material on the first and second surfaces to form respective metal oxides, nitrogen-containing reactant that is able to react with the material on the first and second surfaces to form respective metal nitrides and/or a carbon-containing reactant that is able to react with the material on the first and second surfaces to form respective metal carbides. Thus, a first material is formed on a first surface of the substrate and a second material is formed on a second surface of the substrate even though both surfaces are exposed to the same chemistries. As mentioned above, the first and second materials may have different material properties.

In some embodiments a first surface is a metal or metallic surface and a second surface is a dielectric surface.

In some embodiments the first metal or semimetal reactant can comprise silicon. In some embodiments the first metal or semimetal reactant is a semimetal reactant such as a silicon reactant. In some embodiments, the silicon reactant may have a formula $Si_a(NR1R')_bR2_c$, or $Si_a(OR')_bR1_c$, or $Si_aX_bR_c$, wherein each R1 and R2 may be independently selected from H and C1 to C6 hydrocarbons, R' may be selected from C1 to C6 hydrocarbons, X may be selected from a group consisting of F, Cl, Br and I, and a is an integer from 1 to 4, b is an integer from 1 to 2a+2, and c is an integer 2a+2−b. In some embodiments the first metal or semimetal reactant may comprise one or more of hexamethyldisilazane (HMDS), tetramethyldisilazane (TMDS), diethylaminosilane, and hexakis(ethylamino)disilane.

In some embodiments, the first metal or semimetal reactant can comprise palladium. In some embodiments, the first metal or semimetal reactant can comprise germanium, tungsten, zinc, ruthenium, iron and/or platinum.

In some embodiments the second metal or semimetal reactant is a metal or semimetal reactant comprising germanium, tungsten, zinc, ruthenium, iron, platinum, molybdenum, cobalt, copper, aluminum, zirconium, hafnium, titanium, lanthanum, and/or erbium. In some embodiments the second metal or semimetal reactant is an aluminum reactant. An aluminum reactant may comprise an alkylaluminum compound, such as trimethylaluminum (TMA). In some embodiments an aluminum reactant may comprise oxygen. In some embodiments, an aluminum reactant may comprise nitrogen. For example, the aluminum reactant may have the formula $AlR_3$, or $AlR_x(OR)_y$, or $AlR_x(NRR')_y$, or $AlR_xH_y$, wherein x is 0, 1 or 2, and y is 3-x, and wherein R is H or any C1 to C6 hydrocarbon group, and R' is any C1 to C6 hydrocarbon group. Specifically, an aluminum reactant may comprise $Al(iPr_2AMD)_3$, $Al(tBu_2AMD)_3$, $Al(iPr_2FMD)_3$, or $Al(tBu_2FMD)_3$, wherein iPr stands for isopropyl, tBu stands for tert-butyl, AMD for acetamidinate and FMD for fromaimidnate.

In some embodiments, the first metal or semimetal reactant can comprise palladium and the second metal or semimetal reactant can comprise germanium, tungsten, zinc, ruthenium, iron or platinum. In some embodiments, the first metal or semimetal reactant can comprise palladium, and the second metal or semimetal reactant can comprise hafnium, titanium, aluminum, molybdenum cobalt or copper.

In some embodiments the first metal or semimetal reactant can comprise silicon and the second metal or semimetal reactant can comprise germanium, tungsten, zinc, ruthenium, iron or platinum. In some embodiments, the first metal or semimetal reactant can comprise silicon and the second metal or semimetal reactant can comprise hafnium, titanium, aluminum, molybdenum cobalt or copper.

In some embodiments, the first metal or semimetal reactant can comprise germanium, tungsten, zinc, ruthenium, iron and/or platinum, and the second metal or semimetal reactant can comprise hafnium, titanium, aluminum, molybdenum cobalt or copper.

Atomic Layer Deposition (ALD) Type Processes

In some embodiments ALD type processes are used to simultaneously deposit two different materials on two different surfaces. ALD type processes are based on controlled, self-limiting surface reactions of precursor chemicals and other reactants. Gas phase reactions are avoided by alternately and sequentially contacting the substrate with the reactants. Vapor phase reactants are separated from each other, for example, by removing excess reactants and/or reactant byproducts from the reaction chamber between reactant pulses.

Briefly, a substrate comprising a first surface and second, different surface is heated to a suitable deposition temperature, generally at lowered pressure. Deposition temperatures are generally maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature varies depending on the type of film being deposited and the reactants and passivation agent being utilized. In some embodiments the deposition temperature is preferably at or below about 400° C., more preferably at or below about 200° C. and most preferably from about 20° C. to about 200° C.

In each ALD cycle the surfaces of a substrate are contacted with a vapor phase passivation reactant, first and second metal or semimetal vapor phase reactants and one or more additional vapor phase reactants. In some embodiments a pulse of a vapor phase reactant is provided to a reaction space containing the substrate. In some embodiments the substrate is moved to a reaction space containing a vapor phase reactant. Conditions are preferably selected such that each reactant reacts with the appropriate surface to obtain the desired selective deposition. The appropriate contacting times can be readily determined by the skilled artisan based on the particular circumstances. Excess reactant and reaction byproducts, if any, are removed from the substrate surfaces, such as by purging with an inert gas or by removing the substrate from the presence of the reactant.

Purging means that vapor phase reactants and/or vapor phase byproducts are removed from the substrate surface such as by evacuating a chamber with a vacuum pump and/or by replacing the gas inside a reactor with an inert gas such as argon or nitrogen. Typical purging times are from about 0.05 to about 20 seconds, more preferably between about 1 and about 10 seconds, and still more preferably between about 1 and about 2 seconds. However, other purge times can be utilized if necessary, such as where highly conformal step coverage over extremely high aspect ratio structures or other structures with complex surface morphology is needed.

Each deposition cycle can comprise a first phase in which a substrate comprising two different material layers is contacted with a passivation agent to selectively form a passivation layer on the surface of a first material layer relative to the surface of the second material layer. In some embodiments, prior to contacting the first and second surfaces with the passivation agent, one or both surfaces may be treated to provide an appropriate surface termination such that the passivation agent has the desired selectivity for the first surface relative to the second surface. For example, a first metal surface and a second dielectric surface may be treated to provide an oxide on the first metal surface such that a passivation layer is selectively formed on the oxidized metal surface relative to the dielectric surface.

After an appropriate contacting time that allows for selective formation of the passivation layer on the metal surface relative to the dielectric surface, excess passivation agent is then removed from the substrate surface, for example by purging the reaction space.

In a second phase, a first metal or semimetal reactant is contacted with the first and second surfaces. Due to the presence of the passivation layer, the first metal or semimetal reactant only reacts with the non-passivated surface and does not react with the passivated surface. A layer of material comprising the metal or semimetal from the first metal or semimetal reactant is thus formed on the non-passivated surface. Excess first metal or semimetal reactant and reaction by-products are then removed from the substrate surface, for example by purging the reaction space.

In a third phase, a second metal or semimetal reactant is contacted with the first and second surfaces. The second metal or semimetal reactant reacts with both the passivated and unpassivated surfaces. Thus, a layer of material comprising the metal or semimetal from the second metal or semimetal reactant is formed on the passivated surface while a layer of material comprising the metal or semimetal from the second metal or semimetal reactant and the metal or semimetal from the first metal or semimetal reactant is formed on the non-passivated surface. Excess second metal or semimetal reactant and reaction byproducts are then removed from the substrate surface, such as by purging the reaction space.

In a fourth phase, the first and second surfaces are contacted with an additional non-metal, non-semimetal reactant, such as an oxygen reactant, a nitrogen reactant or a carbon reactant. The third reactant reacts with the material on the passivated surface and the material on the non-passivated surface, such as by forming metal or semimetal oxides, nitrides, carbides, oxynitrides or oxycarbides. Excess third reactant and reaction byproducts are then removed from the substrate surface such as by purging the reaction space.

Additional phases comprising alternately and sequentially contacting the surfaces of the substrate with other reactants and removing the reactants from the surface can be included to form more complex materials.

In some embodiments, each phase of each cycle is self-limiting. An excess of reactant precursors may be supplied in each phase to saturate the susceptible structure surfaces. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during the cycle.

Removing excess reactants and reaction byproducts from the substrate surface can include evacuating some or all of the contents of a reaction space and/or purging a reaction space, such as with helium, nitrogen, or another inert gas. In some embodiments, purging can comprise turning off the flow of the reactive gas while continuing to flow an inert carrier gas to the reaction space. In some embodiments excess reactants and reaction byproducts are removed from the substrate surface by moving the substrate, for example to a different reaction space.

The reactants employed in the ALD type processes may be solid, liquid, or gaseous materials under standard conditions (room temperature and atmospheric pressure), provided that the reactants are in vapor phase before they are contacted with the substrate surface. Contacting a substrate surface with a vaporized reactant means that the reactant vapor is in contact with the substrate surface for a limited period of time. Typically, the contacting time is from about 0.05 to about 10 seconds. However, depending on the substrate type and its surface area, the contacting time may be even longer than 10 seconds. Contacting times can be on the order of minutes in some cases. The optimum contacting time can be determined by the skilled artisan based on the particular circumstances.

The mass flow rate of the reactants can also be determined by one of ordinary skill in the art. In some embodiments, the flow rate of the precursors is between about 1 and about 1000 sccm without limitation, or between about 100 and about 500 sccm.

The pressure in the reaction chamber can be from about 0.01 to about 20 mbar, or from about 1 to about 10 mbar. In some cases the pressure will be higher or lower than these ranges based on the particular circumstances.

Examples of suitable reactors that may be used include commercially available ALD equipment. In addition to ALD reactors, many other kinds of reactors capable of ALD growth of thin films, including chemical vapor deposition (CVD) reactors equipped with appropriate equipment and means for pulsing the precursors can be employed. In some embodiments a flow type ALD reactor is used. Preferably, reactants are kept separate until reaching the reaction chamber, such that shared lines for the precursors are minimized.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

FIG. 1 illustrates a single deposition cycle for selectively depositing a first material on a first surface of a substrate, such as a metal surface, and a second different, material on a second surface of the substrate, such as a dielectric surface. In some embodiments the first material is deposited on only the first surface and the second material is deposited on only the second surface.

A substrate having a first surface and a second surface is provided. The substrate including the first surface and the second surface is contacted alternately and sequentially with a passivation agent 102, a first metal or semimetal reactant 104, a second metal or semi-metal reactant 106 and a third reactant 108.

In some embodiments, the first surface that is to be selectively passivated is a metal or metallic surface. In some embodiments the metal surface may be oxidized on the top surface. In some embodiments the first metal or metallic surface can comprise Cobalt (Co), Copper (Cu), Tungsten (W), and/or Nickel (Ni).

In some embodiments the second surface that is not passivated may be a dielectric surface. In some embodiments, the dielectric surface can be the surface of a silicon based dielectric material such as silicon dioxide ($SiO_2$), silicon nitride (SiN), and/or silicon oxide carbide (SiOC).

At block 102, the first surface and the second surface are simultaneously exposed to a passivation agent in a passivation phase. Examples of passivation agents include at least one of 2,2,6,6,-tetramethyl-3,5-heptanedione (Hthd), Acetylacetone (Hacac), and Hexafluoroacetylacetone (Hfac). In some embodiments the passivation agent is a beta-diketonate. During the passivation phase, the passivation agent may selectively be adsorbed on the first metal surface and not the second dielectric surface, thereby forming a passivation layer on the surface of the metal layer. For example, in some embodiments, the first surface may comprise ruthenium, the second surface may comprise a silicon-containing material, such as silicon oxide, and the passivation agent may be an allyl, such as an allyl benzene. In some embodiments, the first surface may comprise copper, the second surface may comprise a silicon-containing material, such as silicon oxide, and the passivation agent may be a thiol. In some embodiments, the first surface may comprise a metal or a metal oxide, the second surface may comprise a silicon-containing material, such as silicon oxide, and the passivation agent may comprise a cyclopentadienyl compound. After exposing the first and second surfaces to the passivation agent, excess passivation agent may be removed from the first surface and the second surface, such as by purging.

At block 104, the first surface and the second surface are simultaneously exposed to a first vapor-phase metal or semimetal reactant. The first metal or semimetal reactant can be a semimetal reactant such as a silicon reactant. In some embodiments the first metal or semimetal reactant is hexamethyldisilazane (HMDS), tetramethyldisilazane (TMDS), diethylaminosilane or hexakis(ethylamino)disilane. In some embodiments the first metal or semimetal reactant has a molecular size such that the passivation layer sterically prevents the first metal or semimetal reactant from contacting and reacting with the first metal surface. Therefore, the first metal or semimetal reactant contacts and reacts preferentially with the second surface, which does not include the passivation layer. After the first surface and the second surface are exposed to the first metal or semimetal reactant, excess first metal or semimetal reactant may be removed from the first surface and the second surface, such as by purging the reaction space.

At block 106, the first surface and the second surface are simultaneously exposed to a second metal or semimetal reactant. In some embodiments, the second metal or semimetal reactant can be a metal reactant such as an aluminum reactant, a zirconium reactant, a hafnium reactant, a titanium reactant, a lanthanum reactant, and/or an erbium reactant. In some embodiments the second metal or semimetal reactant is trimethylaluminum (TMA). The molecular size of the second metal or semimetal reactant can be such that the passivation agent does not sterically hinder or block the reaction of the second metal or semimetal reactant with the first surface. Therefore, the second metal or semimetal reactant may contact and react with both the first passivated surface and the second non-passivated surface. After the first surface and the second surface are simultaneously exposed to the second metal or semimetal reactant, excess second metal or semimetal reactant may be removed from the first surface and the second surface, such as by purging the reaction space.

The first surface and the second surface can further be exposed to one or more additional reactants, such as an oxygen reactant, a nitrogen reactant, and/or a carbon reactant. The oxygen reactant may comprise, for example, water ($H_2O$), ozone ($O_3$), molecular oxygen ($O_2$), air, or another oxidant. When the first surface and the second surface are exposed to an oxidizing agent, the material deposited on the first surface and the second surface can be oxidized to form a first oxide material on the first surface and a second oxide material on the second surface. Similarly, a nitrogen reactant can be used to form metal nitrides and/or a carbon reactant can be used to form metal carbides. A nitrogen reactant may comprise, consist essentially of, or consist of, for example, ammonia, hydrazine, methylhydrazine, 1,1-dimethylhydrazine, tert-butylhydrazine, phenylhydrazine, 1,1-diphenylhydrazine, 1-aminopiperidine, 1-aminopyrrolidine, aziridine, 1-aminoaziridine, azo-tert-butane, aniline, C1-C6 alkylamines and dialkylamines (including branched and cyclic alkyl groups). A carbon reactant may comprise, consist essentially of, or consist of, tor example, Ethylene, acetylene, propadiene, 1,3-butadiene, 2,4-dimethyl-1,3-butadiene, 1,3-cyclohexadiene, 1,4-cyclohexadiene, chloromethane, dichloromethane, chloroform, carbon tetrachloride, bromomethane, dibromomethane, bromoform, carbon tetrabromide, iodomethane, diiodomethane, iodoform, carbon tetraiodide, bromoethane, iodoethane, 1,2-dibromoethane, 1,2-diiodoethane, allyl chloride, allyl bromide, allyl iodide. As mentioned above, additional phases using additional reactants can be utilized to form more complex materials, such as oxynitrides or oxycarbides. After the first surface and the second surface are exposed to an additional reactant, the excess reactant may be removed from the first surface and the second surface.

In some embodiments, the first material that is deposited on the first surface comprises a metal or semimetal from the first second metal or semimetal reactant but not a metal or semimetal from the second first metal or semimetal reactant. On the other hand, the second material that is deposited on the second surface comprises metals or semimetals from both the first and second metal or semimetal reactants. For example, in some embodiments a first metal surface and second dielectric surface are alternately and sequentially contacted in a deposition cycle with a silicon reactant, an aluminum reactant and an oxygen reactant. In some embodiments the metal surface comprises Co, Co, Ni or W and the dielectric surface comprises $SiO_2$. Hacac, Hfac or Hthd may be used as the passivation agent, diethylaminosilane or hexakis (ethylamino)disilane may be used as the first metal or semimetal reactant and TMA may be used as the second metal or semimetal reactant. Water or other oxidizing agents may be used as the third reactant. That is, in some embodiments a deposition cycle comprises alternately and sequentially contacting a first metal surface and second dielectric surface with a passivation agent comprising Hacac, Hthd, and/or Hfac, a first metal or semimetal reactant comprising diethylaminosilane or hexakis (ethylamino)disilane, a second metal or semimetal reactant comprising TMA and a third oxygen reactant such as water. The deposition cycle may be repeated two or more times and selectively deposits aluminum oxide ($Al_2O_3$) on the metal layer and aluminum silicate ($Al_XSi_YO$) on the dielectric surface.

Thus, the first material deposited on the metal surface has different material properties than the second material deposited on the dielectric surface. For example, the first material can have a different etch rate, different conductivity, different density, different refractivity or other material properties that are different than the second material.

In some embodiments, removing excess reactants or passivation agents can include a purge cycle in which excess reactants and/or reaction by-products are removed from the reaction space with the aid of a purge gas. The purge cycle can include a purge gas, for example, an inert gas such as Helium (He) or Argon (Ar).

As mentioned above, although referred to as first, second and third reactants, the reactants may be provided in any order in each deposition cycle, and may be provided in different orders in different deposition cycles.

In some embodiments, the process can include a second deposition cycle in addition to the first deposition cycle discussed above. In the second deposition cycle the substrate can be alternately and sequentially exposed to one or more additional reactants. In some embodiments the substrate may be exposed to the passivation agent and one of the first or second metal or semimetal reactants used in the first deposition cycle, but not to the other first or second metal or semimetal reactant used in the first deposition cycle. For example, in a second deposition cycle the first and second surfaces of the substrate may be alternately and sequentially exposed to the passivation agent and the first metal or semimetal reactant but without exposing the first surface and the second surface to the second metal or semimetal reactant (block 106). Therefore, the second deposition cycle may include exposing the first surface and the second surface alternately and sequentially with a passivation agent and a first metal or semimetal reactant that is blocked from reacting by the passivation agent. In this way, the second cycle may differentially contribute material comprising the metal or semimetal from the first metal or semimetal reactant to the non-passivated surface. Thus, the second cycle may be used to tune or adjust the concentration of one of the metals or semimetals in the material that is deposited on the non-passivated surface. In some embodiments a different reactant is utilized in the second cycle to add additional components to one or both surfaces, and/or to deposit a different material on one or both surfaces. The second deposition cycle can further include exposing the first surface and the second surface of the substrate to an oxidizing agent, a nitrogen reactant, or a carbon reactant. The second deposition cycle can be used, for example, to adjust the composition of the second material on the second surface.

Each deposition cycle can be repeated sequentially a predetermined number of times and two (or more) different deposition cycles can be carried out at a desired ratio to selectively deposit films with a desired composition and thickness. For example, the first deposition cycle can be repeated X times. If a second deposition cycle is carried out, the second deposition cycle can be repeated Y times, where X and Y are integers. The specific numbers for X and Y and the ratio of X:Y can be selected to achieve a desired composition and thickness.

In some embodiments a first deposition cycle is carried out as described above, in which a substrate comprising a first metal surface and a second dielectric surface is alternately and sequentially exposed to a passivation agent, a first silicon reactant, a second metal or semimetal reactant and a third oxygen, nitrogen or carbon reactant. In some embodiments, the reactants are selected such that the first deposition cycle selectively deposits a metal oxide on the metal layer and a metal silicates on the dielectric surface. For example, the metal silicates may be aluminum silicate ($Al_xSi_yO$), titanium silicate ($Ti_XSi_YO$), tantalum silicate ($Ta_XSi_YO$), hafnium silicate ($Hf_XSi_YO$), zirconium silicate ($Zr_XSi_YO$), yttrium silicate ($Y_XSi_YO$), and lanthanum silicate ($La_XSi_YO$). The other metal oxides may be titanium oxide ($TiO_2$), tantalum oxide ($Ta_2O_5$), hafnium oxide ($HfO_2$), zirconium oxide ($ZrO_2$), yttrium oxide ($Y_2O_3$), and lanthanum oxide ($La_2O_3$).

In some embodiments a substrate comprising a first metal surface and a second dielectric surface, such as a Cu surface and a $SiO_2$ surface, is alternately and sequentially exposed to a passivation agent comprising Hacac, Hthd, Hfac, and/or a beta-diketonate, a first silicon reactant comprising, for example, HMDS, TMDS, diethylaminosilane, and/or hexakis(ethylamino)disilane, a second metal reactant such as an aluminum reactant comprising TMA and a third oxygen reactant such as water. The first deposition cycle selectively deposits aluminum oxide ($Al_2O_3$) on the metal layer and aluminum silicate ($Al_XSi_YO$) on the dielectric surface.

A second deposition cycle may be carried out to tune the silicon content of the aluminum silicate on the dielectric surface. The second deposition cycle may comprise alternately and sequentially exposing the first surface and the second surface to the passivation agent, the silicon reactant and the oxygen reactant. Because the passivation agent passivates the metal surface (which may comprise aluminum oxide from prior deposition cycles), the second metal or semimetal reactant reacts only with the dielectric surface (which may comprise aluminum silicate from the prior deposition cycles), such that in the second deposition cycle, silicon oxide is selectively deposited over the dielectric surface relative to the metal surface. By selecting an appropriate ratio of first and second deposition cycles, aluminum silicate with an increased silicon concentration may be formed over the dielectric surface.

Figure 2A:
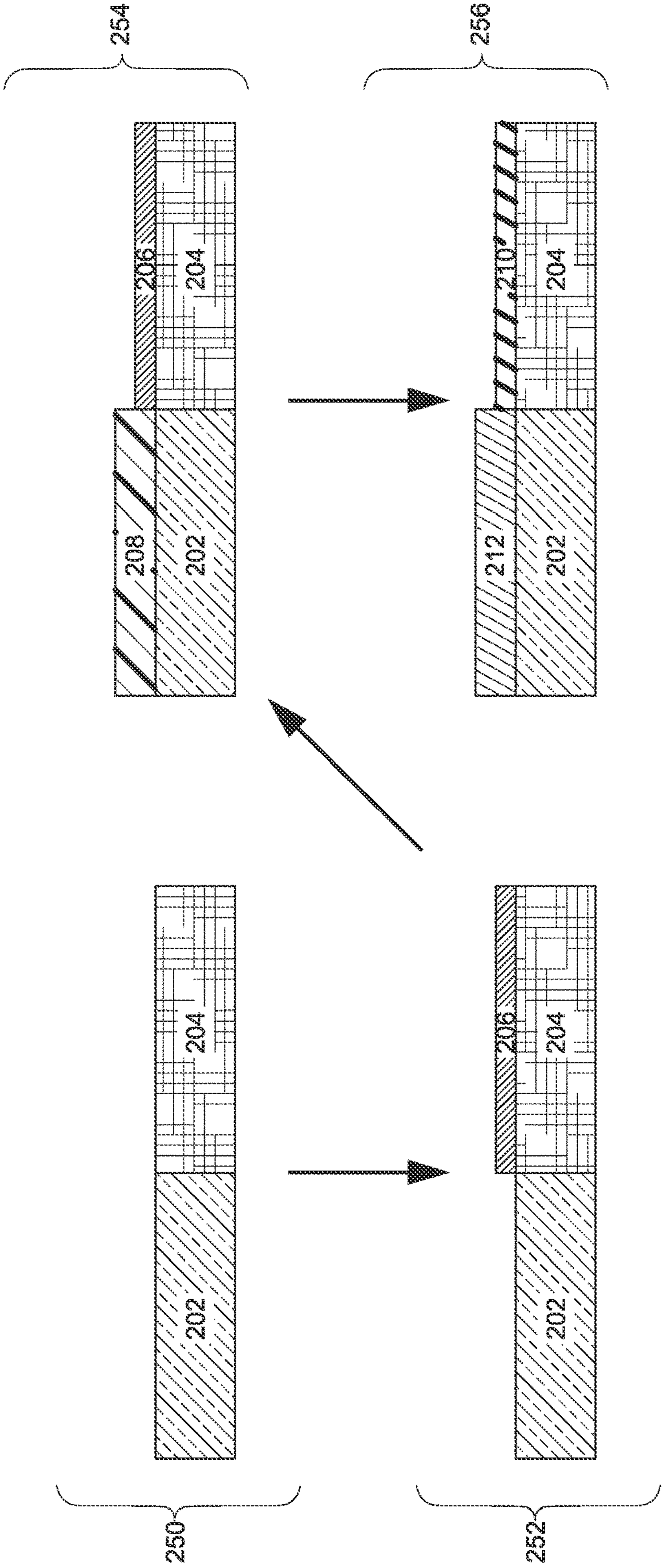
FIG. 2A and FIG. 2B schematically illustrate phases of an exemplary embodiment of a process that simultaneously and selectively deposits two different materials on two different surfaces of a substrate.

FIG. 2A illustrates various stages of an exemplary implementation of a cyclical vapor deposition process such as that described in FIG. 1. In FIG. 2A, at 250, a substrate with a first surface 204 and a second surface 202 is provided. The first surface 204 can be a different material than the second surface 202. In some embodiments, the first surface 204 can be metal or metallic whereas the second surface 202 can be a dielectric surface. In some embodiments the first metal or metallic surface can comprise, for example, Co, Cu, W, and/or Ni. In some embodiments a first metal surface comprises a surface oxide on the top of the first metal surface. The surface oxide on the first metal surface can be an oxide of the metal of the first metal surface, for example cobalt oxide, copper oxide, or tungsten oxide. In some embodiments, the second dielectric surface can comprise $SiO_2$, SiN, and/or SiOC.

During the passivation phase 252, a passivation layer 206 is selectively formed on the first surface 204 by exposing the first and second surfaces to a passivation agent, such as Hthd or Hacac. The passivation layer 206 can form on a surface oxide on the first surface 204 if present. During the passivation phase 252, the passivation agent selectively reacts with the first surface 204 and not the second surface 202 such that the passivation layer is selectively formed on the first surface relative to the second surface. As described above, the passivation agent can be, for example, Hthd, Hfac or Hacac.

In the first metal or semimetal reactant phase 254 the passivated first surface 204 and the second surface 202 are exposed to a first metal or semimetal reactant. In some embodiments the first metal or semimetal reactant is a silicon reactant such as diethylaminosilane or hexakis(ethylamino)disilane. The passivation layer 206 on the first surface 204 sterically prevents the first metal or semimetal reactant from contacting the first surface 204. Thus, the first metal or semimetal reactant reacts selectively with the second surface 202 and a layer 208 of reactant species comprising a first metal or semimetal, such as silicon, is selectively deposited on the second surface 202 and not the first surface 204.

In the second metal or semimetal reactant phase 256 the substrate is exposed to the second metal or semimetal reactant. The second metal or semimetal reactant may be, for example, an aluminum reactant such as TMA. In some embodiments the second metal or semimetal reactant may be a Zr reactant, a Hf reactant, a Ti reactant, a La reactant or a Er reactant. The presence of the passivation layer 206 does not prevent the second metal or semimetal reactant from contacting and reacting with the first surface 204. Thus, the second metal or semimetal reactant contacts and reacts with both the first surface 204 and second surface 202. As a result, a first layer 212 is formed on the second surface 202 that comprises a metal or semimetal from the first metal or semimetal reactant and a metal or semimetal from the second metal or semimetal reactant and a second layer 210 is formed on the first surface 204 that comprises only a metal or semimetal from the second metal or semimetal reactant. For example, when the first metal or semimetal reactant is a silicon reactant and the second metal or semimetal reactant is an aluminum reactant, the first layer 212 on the non-passivated second surface 204 may comprise silicon and aluminum while the second layer 210 on the passivated surface 204 comprises aluminum but not silicon.

Figure 2B:
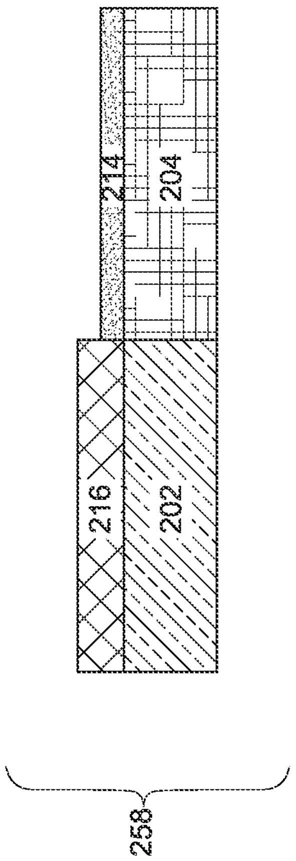

As discussed above, an additional phase 258 can be included in a deposition cycle in which the substrate is exposed to a third reactant, such as an oxygen reactant, nitrogen reactant and/or carbon reactant. FIG. 2B depicts the substrate after exposure to an additional reactant as described above. In some embodiments, oxygen reactant can comprise water, ozone, molecular oxygen, or air. After exposure to an oxygen reactant, the first layer 212 on the second surface 202 and the second layer 210 on the first surface 204 are converted into a first material 214 on the first surface 204 and a second material 216 on a second surface 202. In the case where the first metal or semimetal reactant is a silicon reactant, the second metal or semimetal reactant is an aluminum reactant, and the third reactant is an oxygen reactant, the first material 214 can be $Al_2O_3$ and the second material 216 can be an aluminum silicate ($Al_xSi_yO$).

In order to increase the thickness of the first material 214 and the second material 216, the phases illustrated in FIGS. 2A and 2B can be repeated until a desired thickness is reached.

Further, as discussed above in some embodiments the content of the second material 216 can be adjusted or tuned by providing one or more second deposition cycles. These tuning cycles mirror the steps of the first deposition cycle as illustrated in FIGS. 2A and 2B but omit the step of exposing the substrate to the second metal or semimetal reactant (as performed in second metal or semimetal reactant phase 256). When this second deposition tuning cycle is performed, first metal or semimetal reactant will still contact the second surface 202, which can increase the amount of metal or semimetal from the first metal or semimetal reactant within the second material 216. However, the first metal or semimetal reactant does not contact the first surface 204 due to the presence of the passivation layer 206 and therefore little to no additional material will be deposited on the first surface 204 in the tuning cycle. In this way, for example, the silicon content of the aluminum silicate can be increased.

Although certain embodiments and examples have been discussed, it will be understood by those skilled in the art that the scope of the claims extend beyond the specifically disclosed embodiments to other alternative embodiments and/or uses and obvious modifications and equivalents thereof.

What is claimed is:

1. A method of selectively depositing different materials on a first surface and a second different surface of a substrate, the method comprising one or more first deposition cycles comprising:

exposing the first and the second surfaces of the substrate to a passivation agent such that a passivation layer is selectively formed on the first surface relative to the second surface;

exposing the first surface, having the formed passivation layer, and the second surfaces of the substrate to a first reactant such that a first element from the first reactant is selectively deposited on the second surface relative to the first surface; and exposing the first surface, having the passivation layer, and the second surface, having the deposited first element, s of the substrate to a second reactant, wherein, such that a first material selectively forms on the first surface simultaneously with a second material selectively forming on the second surface, is selectively formed on the first surface and a second different material is selectively formed on the second surface simultaneously in the one or more first deposition cycles, and wherein one or more of an etch rate, a density, a conductivity, and a refractive index of the first material differs from that of the second material by at least about 5%.

2. The method of claim 1, wherein the etch rate of the first material differs from the etch rate of the second material by at least about 25%.

3. The method of claim 1, wherein the etch rate of the first material is at least about 1.5 times of the etch rate of the second material.

4. The method of claim 1, wherein the density of the first material differs from the density of the second material by at least about 5%.

5. The method of claim 1, wherein the conductivity of the first material is at least about 10 times greater than the conductivity of the second material.

6. The method of claim 1, wherein the refractive index of the first material differs from the refractive index of the second material by at least about 5%.

7. The method of claim 1, wherein the first surface comprises a metal and the second surface comprises a dielectric material.

8. The method of claim 7, wherein the metal comprises Co, Cu, W, Ru and/or Ni.

9. The method of claim 7, wherein the dielectric material comprises silicon dioxide ($SiO_2$), silicon nitride (SiN), and/or silicon oxide carbide (SiOC).

10. The method of claim 1, further comprising contacting the first and second surfaces with an additional reactant comprising an oxygen reactant, a nitrogen reactant or a carbon reactant.

11. The method of claim 1, wherein the passivation agent comprises a di-imine or a beta-diketonate.

12. The method of claim 1, wherein the first reactant comprises hexamethyldisilazane (HMDS), tetramethyldisilazane (TMDS), diethylaminosilane and/or hexakis (ethylamino)disilane.

13. The method of claim 1, wherein the second reactant comprises aluminum, zirconium, hafnium, titanium, lanthanum, and/or erbium.

14. The method of claim 1, further comprising one or more second deposition cycles comprising alternately and sequentially contacting the substrate with the passivation agent and the first reactant.

15. The method of claim 1, wherein the second reactant penetrates the passivation layer on the first surface such that the second reactant reacts with the first and second surfaces surface to form the first material on the first surface and reacts with the second surface, having the deposited first element, to form the second material on the second surface.

16. A method of depositing different materials on a first surface and a different second different surface of a substrate, the method comprising one or more first deposition cycles comprising:

exposing the first and the second surfaces of the substrate to a passivation agent such that a passivation layer is selectively formed on the first surface relative to the second surface, wherein the passivation layer prevents a first metal or semimetal from forming on the first surface;

exposing the first and the second surfaces of the substrate to a first reactant a first metal or semimetal reactant such that the first metal or semimetal from the first reactant is selectively deposited on the second surface relative to the first surface; and exposing the first surface and the second surface, having the deposited first metal or semimetal, of the substrate to a second metal or semimetal to a second reactant including a second metal or semimetal reactant, wherein such that a first material selectively forms on the first surface simultaneously with a second different material selectively forming on the second surface, simultaneously in the one or more first deposition cycles, and wherein the first material differs from the second material with respect to one or more of an etch rate, a density, a conductivity, and a refractive index.

17. The method of claim 16, wherein the etch rate of the first material is at least about 1.5 times of the etch rate of the second material.

18. The method of claim 16, wherein the density of the first material differs from the density of the second material by at least about 5%.

19. The method of claim 16, wherein the first surface comprises a metal and the second surface comprises a dielectric material.

20. The method of claim 16, wherein the first metal or semimetal reactant comprises a first metal or semimetal and wherein the first metal or semimetal reactant reacts with the second surface to form a layer of reactant species comprising the first metal or semimetal, from the first metal or semimetal reactant but does not react with the first surface.

21. The method of claim 16, wherein the second metal or semimetal reactant comprises a second metal or semimetal and wherein the second metal or semimetal reactant penetrates the passivation layer on the first surface such that the second reactant reacts with the first surface to form the first material on the first surface and reacts with the second surface, having the deposited first metal or semimetal, to form the first material on the first surface and the second material on the second surface.

* * * * *